(12) United States Patent
Khazaka

(10) Patent No.: US 12,595,587 B2
(45) Date of Patent: Apr. 7, 2026

(54) METHOD AND A SUBSTRATE PROCESSING APPARATUS FOR FORMING AN EPITAXIAL STACK ON A PLURALITY OF SUBSTRATES

(71) Applicant: ASM IP Holding, B.V., Almere (NL)

(72) Inventor: Rami Khazaka, Leuven (BE)

(73) Assignee: ASM IP Holding B.V., Almere (NL)

( * ) Notice: Subject to any disclaimer, the term of this patent is extended or adjusted under 35 U.S.C. 154(b) by 252 days.

(21) Appl. No.: 18/350,517

(22) Filed: Jul. 11, 2023

(65) Prior Publication Data

US 2024/0026567 A1     Jan. 25, 2024

Related U.S. Application Data

(60) Provisional application No. 63/368,309, filed on Jul. 13, 2022.

(51) Int. Cl.
*C30B 25/16* (2006.01)
*C23C 16/24* (2006.01)
(Continued)

(52) U.S. Cl.
CPC ............ *C30B 25/165* (2013.01); *C23C 16/24* (2013.01); *C23C 16/45529* (2013.01); *C23C 16/45546* (2013.01); *C23C 16/52* (2013.01); *C30B 25/12* (2013.01); *C30B 29/06* (2013.01); *C30B 29/68* (2013.01); *H01L 21/0245* (2013.01); *H01L 21/02532* (2013.01); *H01L 21/02576* (2013.01); *H01L 21/0262* (2013.01);
(Continued)

(58) Field of Classification Search
CPC .............. C23C 16/24; C23C 16/45529; C23C 16/45546; C23C 16/52; C30B 25/02; C30B 25/12; C30B 25/165; C30B 29/06; C30B 29/10; C30B 29/68; H01L 21/02381; H01L 21/02433; H01L 21/0245; H01L 21/02507; H01L 21/02532; H01L 21/02576; H01L 21/0262; H10B 12/01
See application file for complete search history.

(56) References Cited

U.S. PATENT DOCUMENTS 9,812,453 B1     11/2017  Mulfinger
2013/0328126 A1*  12/2013  Tsai ................... H10D 30/0227
                                         257/E21.409
(Continued)

*Primary Examiner* — Hua Qi
(74) *Attorney, Agent, or Firm* — Banner & Witcoff, Ltd.

(57) ABSTRACT

A method for forming an epitaxial stack on a plurality of substrates comprises providing a plurality of substrates to a process chamber and executing deposition cycles, wherein each deposition cycle comprises a first deposition pulse and a second deposition pulse. The epitaxial stack comprises a first epitaxial layer stacked alternatingly and repeatedly with a second epitaxial layer, the second epitaxial layer being different from the first epitaxial layer. The first deposition pulse comprises a provision of a first reaction gas mixture to the process chamber, thereby forming the first epitaxial layer having a first native lattice parameter. The second deposition pulse comprises a provision of a second reaction gas mixture to the process chamber, thereby forming the second epitaxial layer having a second native lattice parameter, wherein the first native lattice parameter lies in a range within 1.5% larger than and 0.9% smaller than the second native lattice parameter.

9 Claims, 5 Drawing Sheets

Figure 1:
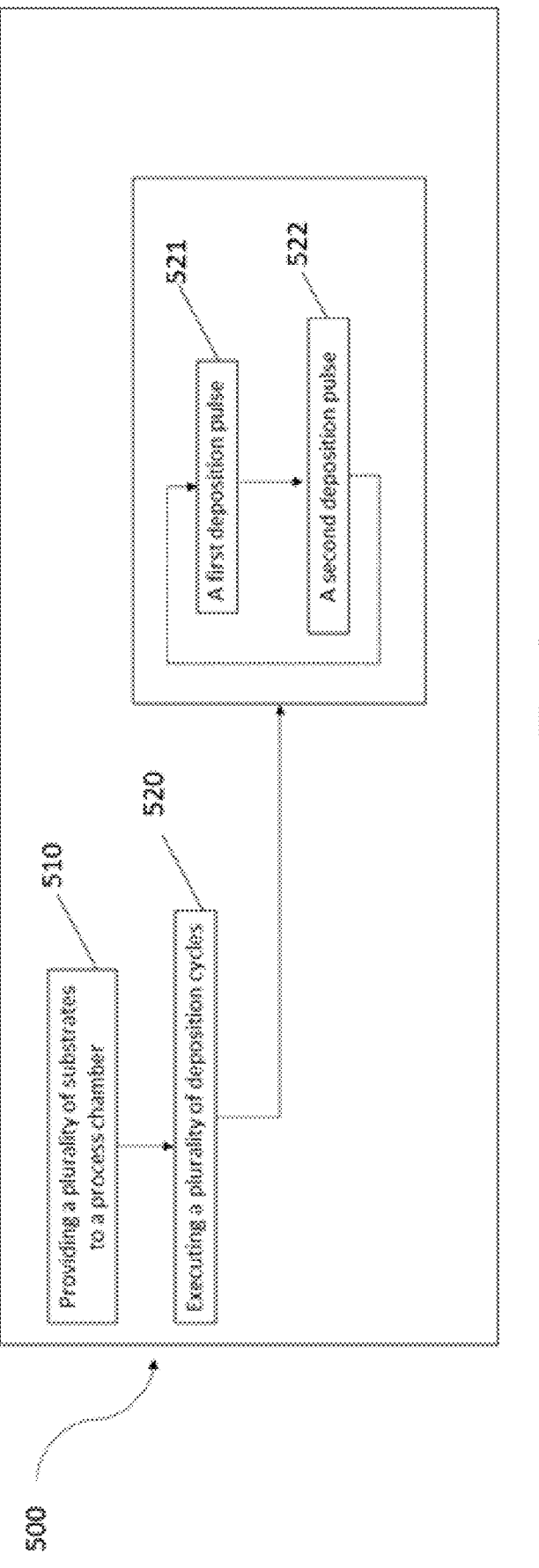

(51) Int. Cl.

| | | |
|---|---|---|
| *C23C 16/455* | (2006.01) | |
| *C23C 16/52* | (2006.01) | |
| *C30B 25/12* | (2006.01) | |
| *C30B 29/06* | (2006.01) | |
| *C30B 29/68* | (2006.01) | |
| *H01L 21/02* | (2006.01) | |
| *H10B 12/00* | (2023.01) | |

(52) U.S. Cl.
    CPC .. *H01L 21/02381* (2013.01); *H01L 21/02433*
                (2013.01); *H10B 12/01* (2023.02)

(56) References Cited

U.S. PATENT DOCUMENTS

| | | | |
|---|---|---|---|
| 2015/0214369 A1 | 7/2015 | Fronheiser | |
| 2016/0141173 A1* | 5/2016 | Moriya | ............. H01L 21/02576 |
| | | | 438/479 |
| 2017/0155001 A1 | 6/2017 | Chen | |
| 2021/0327891 A1* | 10/2021 | Koshizawa | .......... H10D 64/037 |

* cited by examiner

600

610

Providing a plurality of substrates to a process chamber

620

Forming an epitaxial stack on the plurality of substrates

METHOD AND A SUBSTRATE PROCESSING APPARATUS FOR FORMING AN EPITAXIAL STACK ON A PLURALITY OF SUBSTRATES

CROSS-REFERENCE TO RELATED APPLICATION(S)

This application claims the benefit of U.S. Provisional Application 63/368,309 filed on Jul. 13, 2022, the entire contents of which is incorporated herein by reference.

FIELD OF INVENTION

The present disclosure relates to the field of semiconductor processing. More specifically, it relates to a method for forming an epitaxial stack on a plurality of substrates.

BACKGROUND OF THE DISCLOSURE

Shrinkage of device dimensions in semiconductor industry is continuing in order to provide faster processing, improved device performance, increased density as well as providing higher number of chips per substrate for next generation of devices. These have led to the development of three dimensional designs in logic and memory applications such gate-all-around (GAA), 3D NAND and 3D DRAM. These applications rely on forming stack of epitaxial layers with increased stack height. However, this may pose challenges in terms of processing and integration.

A drawback associated with increased epitaxial stack height may lie in being able to maintain a lower stress in the epitaxial stack while increasing its thickness. Unless properly controlled, this may lead to stress relaxation in the stack.

There is therefore, a need in the art for improving the processing of thick epitaxial stacks. Additionally, there is a particular need for improving the manufacturing of 3D DRAM devices for next generation memory applications.

SUMMARY OF THE DISCLOSURE

It is an object of the present disclosure to provide methods that are improved in terms of forming a stack of epitaxial layers. More specifically, it is an object to provide a thick stack of epitaxial layers on a plurality of substrates, whereby a lower stress in the epitaxial stack is achieved. To at least partially achieve this goal, the present disclosure may provide a method and a semiconductor processing apparatus as defined in the independent claims. Further embodiments of the method and the semiconductor processing apparatus are provided in the dependent claims.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In a first aspect, the present disclosure relates to a method for forming an epitaxial stack on a plurality of substrates. The method may comprise providing the plurality of substrates to a process chamber. The method may further comprise executing a plurality of deposition cycles, thereby forming the epitaxial stack on the plurality of substrates. The epitaxial stack may comprise a first epitaxial layer stacked alternatingly and repeatedly with a second epitaxial layer. The second epitaxial layer may be different from the first epitaxial layer. The deposition cycle may comprise a first deposition pulse and a second deposition pulse. The first deposition pulse may comprise a provision of a first reaction gas mixture to the process chamber, thereby forming the first epitaxial layer having a first lattice parameter. The second deposition pulse may comprise a provision of a second reaction gas mixture to the process chamber, thereby forming the second epitaxial layer having a second lattice parameter. The second reaction gas mixture may be different from the first reaction gas mixture. The first lattice parameter may lie in a range within 1.5% larger than and 0.9% smaller than the second lattice parameter.

The inventive method according to the first aspect may allow for reducing a risk for stress relaxation in the epitaxial stack. The method may be particularly advantageous when forming a thick epitaxial stack since reducing the risk for stress relaxation may become more critical as the thickness of the epitaxial stack increases. Reducing stress relaxation for thick epitaxial stacks may be advantageous for the manufacturing of 3D DRAM memory devices.

It may be an advantage of embodiments of the first aspect that the method allows for obtaining a thick epitaxial stack thanks to the reduced risk of stress relaxation on a plurality of substrates. This may be advantageous in improving process throughput. Improved process throughput may further contribute to improvement of manufacturing throughput.

It may be a further advantage of embodiments of the first aspect that the method allows for obtaining an epitaxial stack comprising a plurality of a first and a second epitaxial layers, whereby excellent etch selectivity may be present between the first and the second epitaxial layers. This may be an advantage in semiconductor manufacturing when one of the epitaxial layers need to be selectively removed with respect to the other.

In a second aspect, the present disclosure relates to a method of forming an epitaxial stack on a plurality of substrates. The method may comprise providing the plurality of substrates to a process chamber. The method may further comprise forming the epitaxial stack on the plurality of substrates. The formation of the epitaxial stack may comprise a formation of a first epitaxial layer alternatingly and repeatedly with a formation of a second epitaxial layer. Each of the first epitaxial layers may comprise a phosphorus concentration in a range of about 0.5 atomic % to about 3 atomic % and a silicon concentration in a range of about 97 atomic % to about 99.5 atomic %. Each of the second epitaxial layers may comprise a silicon concentration of about 100 atomic %.

It may be an advantage of embodiments of the second aspect that it may allow for forming an epitaxial stack with reduced stress relaxation. It may further be an advantage that a thick epitaxial stack may be obtained thanks to the reduced stress relaxation.

It may thus be an advantage of the embodiments of the second aspect that the epitaxial stack formed may be used in the manufacturing of 3D DRAM memory devices.

It may further be an advantage of embodiments of the second aspect that a yield of the epitaxial film formation process may be improved thanks to the reduced stress relaxation of the epitaxial stack.

It may be a further advantage of embodiments of the second aspect that the method allows for obtaining an epitaxial stack, whereby excellent etch selectivity may be present between the first and the second epitaxial layers. This may be an advantage in semiconductor manufacturing when one of the epitaxial layers need to be selectively removed with respect to the other.

In a third aspect, the present disclosure relates to a substrate processing apparatus for forming an epitaxial stack on a plurality of substrates. The apparatus may comprise a process chamber extending in a longitudinal direction, a substrate boat for holding a plurality of substrates, the substrate boat being receivable in the process chamber. The apparatus may also comprise a heater configured for heating and maintaining process temperature in the process chamber and a pressure controller configured for attaining and maintaining process pressure in the process chamber. The apparatus may also comprise a silane precursor storage module. The precursor storage module may comprise at least one of a mono silane precursor, a high order straight chain silane precursor, a high order branched silane precursor and a cyclic precursor. The apparatus may also comprise a Group-VA element precursor storage module. The apparatus may also comprise a controller for executing instructions that may be comprised in a non-transitory computer readable medium and to cause the substrate processing apparatus to form the epitaxial stack on the plurality of substrates in accordance with a method according to embodiments of the present disclosure.

The substrate processing apparatus may be advantageous in forming the epitaxial stack on the plurality of substrates, whereby the substrates may have reduced stress relaxation. Particularly, the substrate processing apparatus may provide the advantage of forming thick epitaxial stacks on the plurality of substrates, whereby the substrates may have reduced stress relaxation.

Thus, the semiconductor processing apparatus may be advantageous for the manufacturing of memory devices such as for example 3DDRAM devices.

It may be an advantage of embodiments of the third aspect that it may reduce manufacturing costs and reduce manufacturing throughput as plurality of substrates may be processes at a time.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure. Like reference numbers will be used for like elements in the drawings unless stated otherwise.

FIG. 1: shows a flowchart of an exemplary method according to embodiments of the first aspect of the present disclosure.

Figure 2:
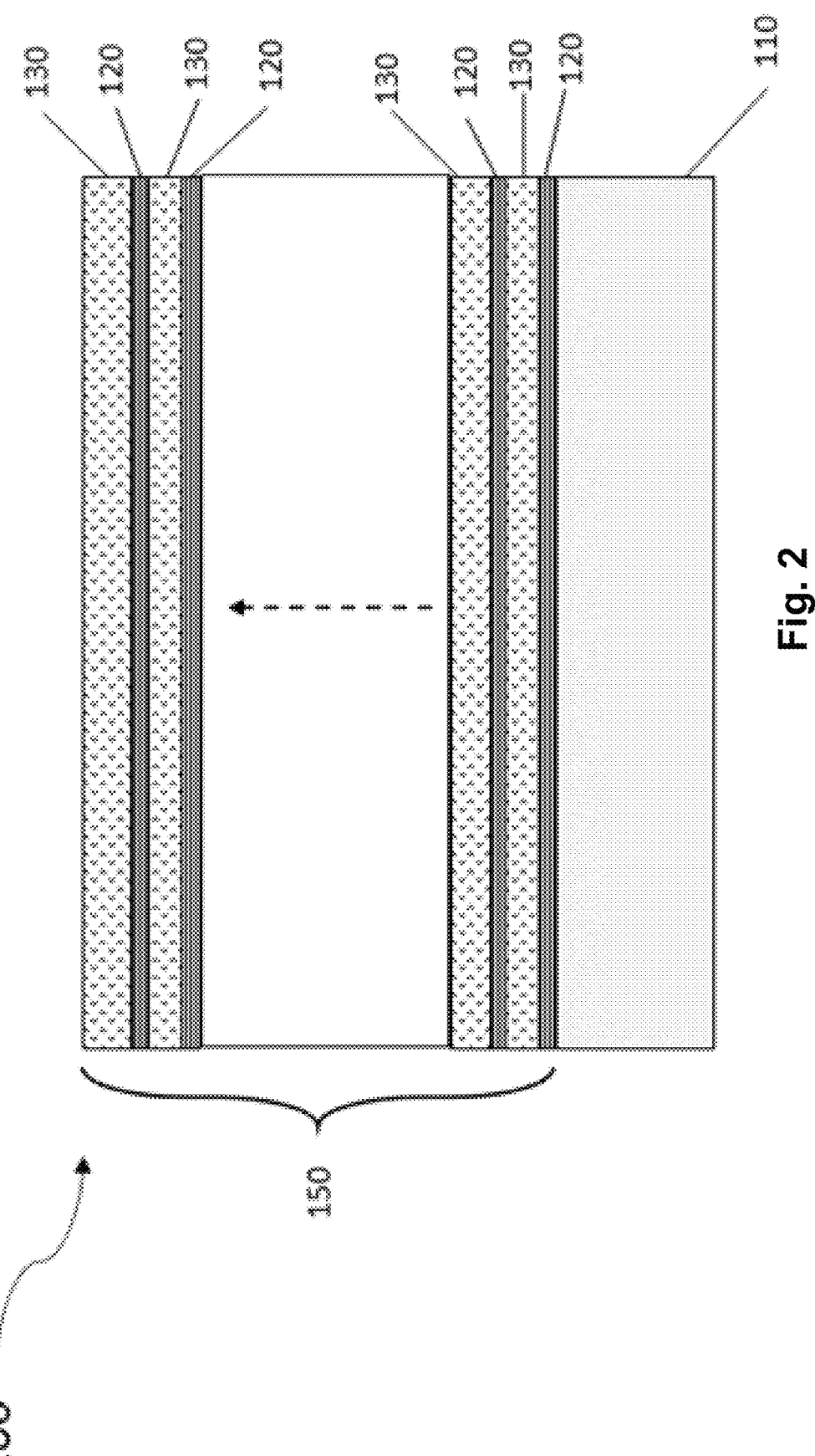

FIG. 2: is a schematic cross-section of the epitaxial stack according to embodiments of the first aspect or the second aspect of the present disclosure.

Figure 3:
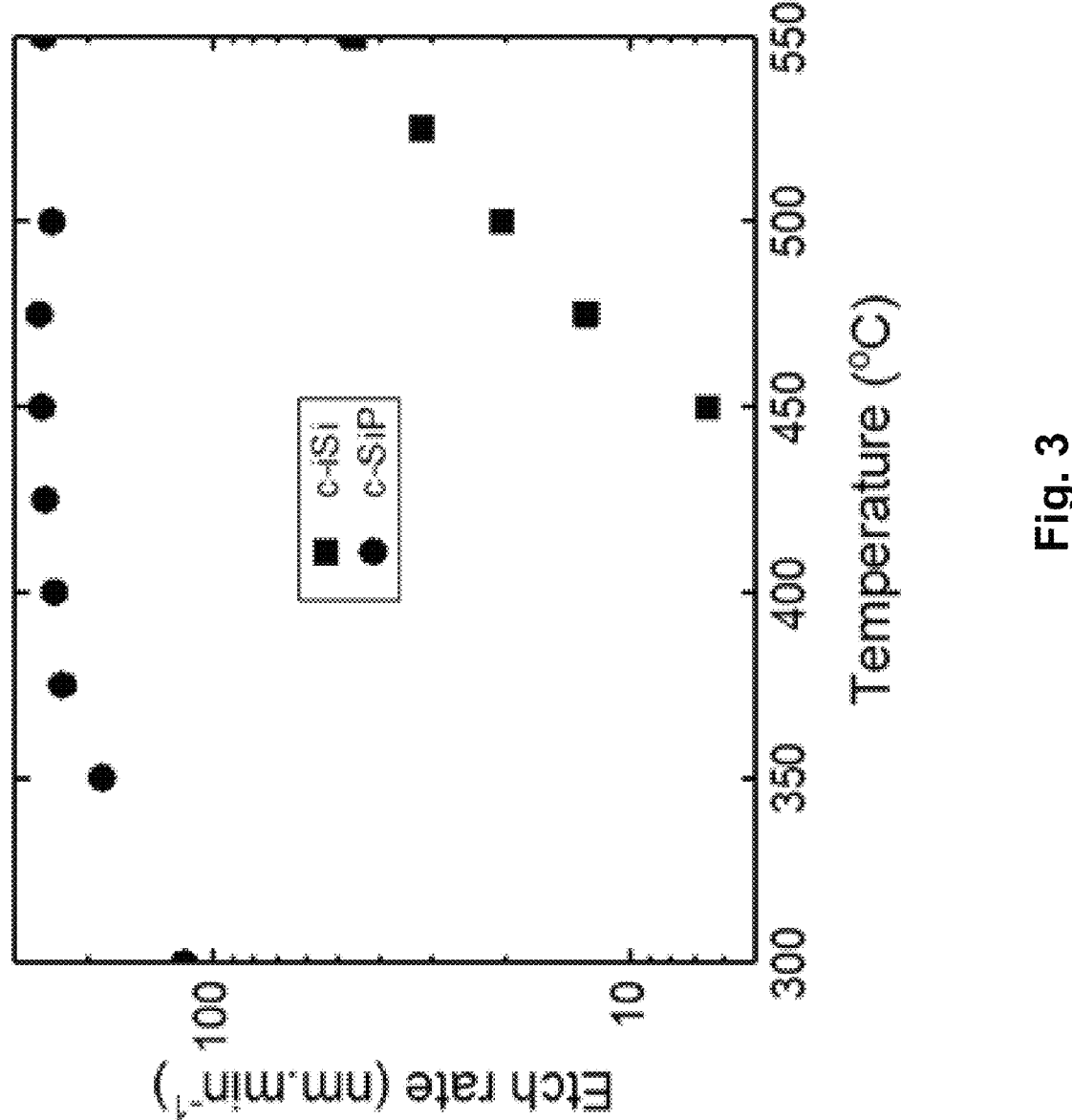

FIG. 3: Etch rate vs. temperature between crystalline SiP (3 atomic %) and crystalline intrinsic Si.

Figure 4:
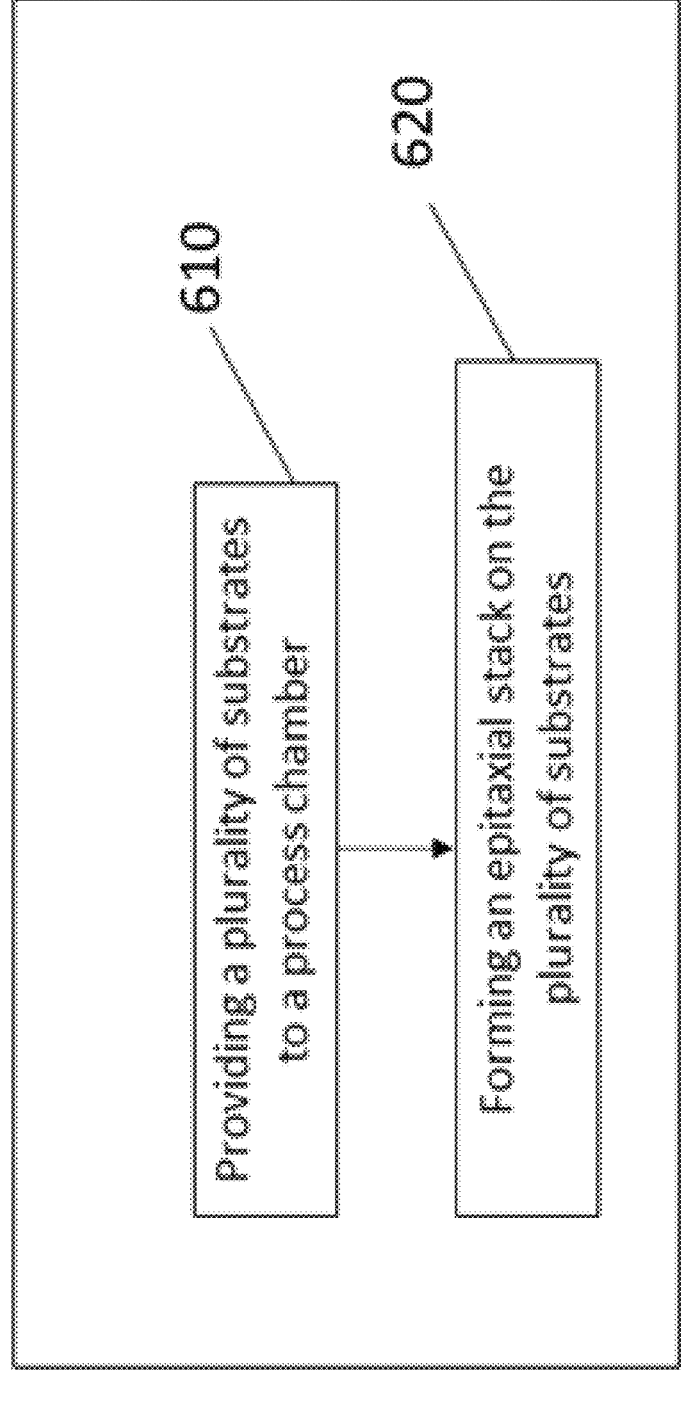

FIG. 4: shows a flowchart of an exemplary method according to embodiments of the second aspect of the present disclosure.

Figure 5:
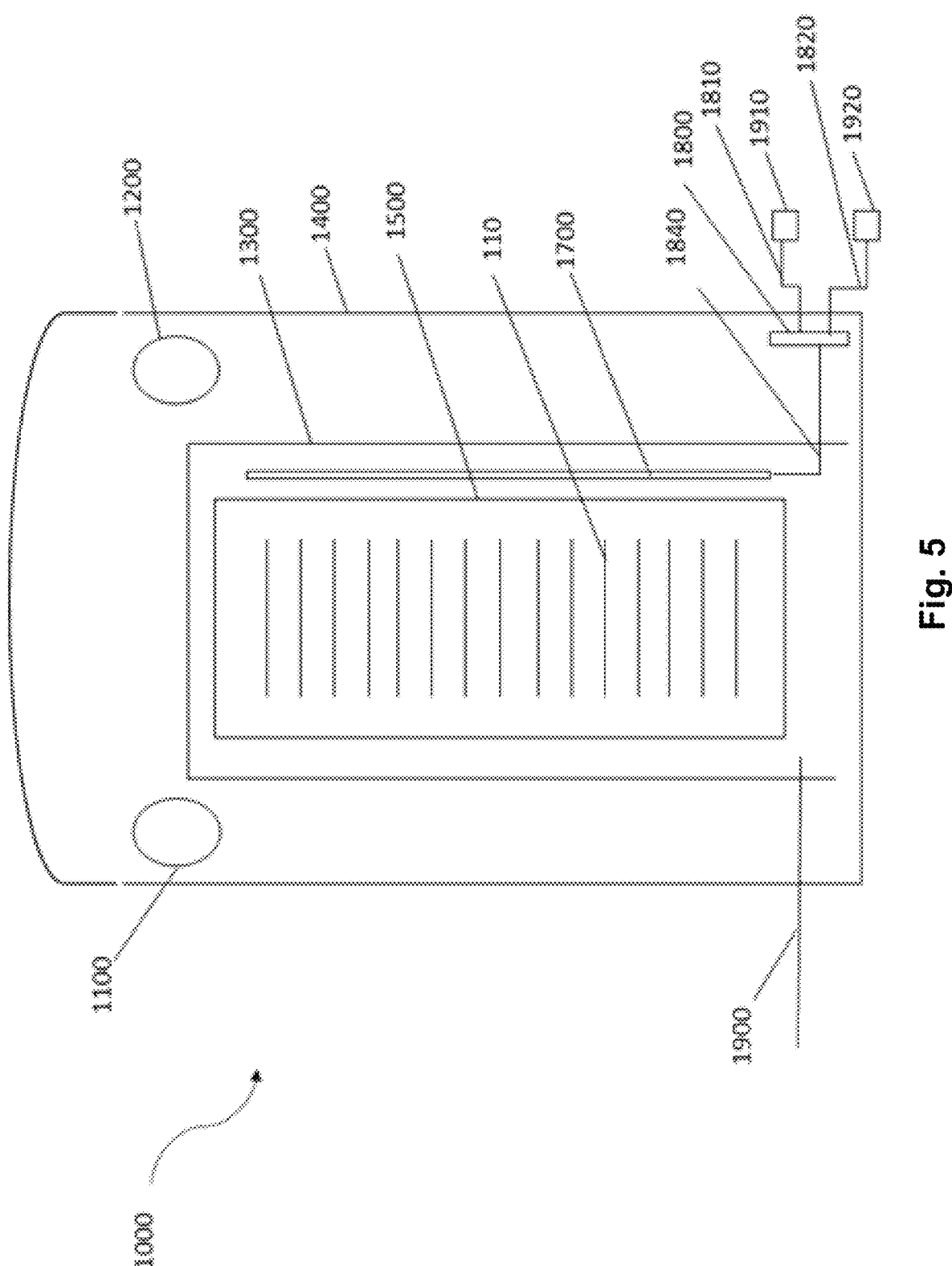

FIG. 5: shows a schematic representation of a substrate processing apparatus according to embodiments of the third aspect of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

It is to be noticed that the term "comprising", as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

Reference throughout the specification to "embodiments" in various places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present invention. Thus, phrases appearing such as "in some embodiments" in different places throughout the specification are not necessarily referring to the same collection of embodiments, but may.

It is to be noticed that the term "comprise substantially" used in the claims refers that further components than those specifically mentioned can, but not necessarily have to, be present, namely those not materially affecting the essential characteristics of the material, compound, or composition referred to.

The following terms are provided solely to help in the understanding of the disclosure.

As used herein and unless provided otherwise, the term "vertical furnace" refers to a processing apparatus having a process chamber extending in a vertical direction with respect to the ground and is able to process a plurality of substrates at a single process run.

As used herein and unless provided otherwise, the term "native lattice parameters" refers to the relaxed lattice parameter of the layer in its unstrained state.

As used herein and unless provided otherwise, the term "actual lattice parameter" refers to the lattice parameter when it is deposited on a substrate or in other words when it is present in a structure.

As used herein and unless provided otherwise, the term "high order silane" refers to a silane having 2 or more silicon atoms.

We now return to FIG. 1 showing a flowchart of an exemplary method according to embodiments of the first aspect of the present disclosure and FIG. 2 showing a schematic cross-section of the semiconductor structure (100) with an epitaxial stack (150) formed on a substrate (110) according to embodiments of the first aspect or the second aspect of the present disclosure.

In a first aspect, the method (500) of forming an epitaxial stack (150) on a plurality of substrates may comprise providing (510) the plurality of substrates to a process chamber. In embodiments, the plurality of substrates may be arranged in a substrate boat constructed and arranged to hold the plurality of substrates. The process chamber may, in embodiments, extend in a vertical direction and may be suitable for receiving the substrate boat for holding the plurality of substrates.

In embodiments, the process chamber may thus, be comprised in a vertical furnace. This may advantageously allow for processing the plurality of substrates at the same time in the process chamber.

In embodiments, each substrate (110) of the plurality of substrates may comprise a semiconductor layer. The semiconductor layer may, in some embodiments, be a silicon layer. The silicon layer may, in embodiments, be a Si{100}, a Si {110}, or a Si{111} layer.

In embodiments, each substrate (110) of the plurality of substrates may be semiconductor substrates. The semiconductor substrates may, in some embodiments, be Si{100}, Si {110}, or Si{111} substrates.

The method may further comprise executing a plurality of deposition cycles (520), thereby forming the epitaxial stack (150) on the plurality of substrates. The epitaxial stack (150) may comprise a first epitaxial layer (120) and a second epitaxial layer (130). The first epitaxial layer (120) and the second epitaxial layer (130) may be stacked alternatingly and repeatedly with one another when forming the epitaxial stack (150) and the first epitaxial layer (120) may be different from the second epitaxial layer (130). Each deposition cycle of the plurality deposition cycles may comprise a first deposition pulse (521) and a second deposition pulse (522). The first deposition pulse (521) may comprise a provision of a first reaction gas mixture to the process chamber, thereby forming the first epitaxial layer (120) having a first lattice parameter. The second deposition pulse (522) may comprise a provision of a second reaction gas mixture to the process chamber, thereby forming the second epitaxial layer (130) having a second lattice parameter. In the epitaxial stack (150) each of the first epitaxial layers (120) may appear being sandwiched in between the second epitaxial layers (130) or each of the second epitaxial layers (130) may appear being sandwiched in between the first epitaxial layers (120). The second reaction gas mixture may be different than the first reaction gas mixture. The first lattice parameter and the second lattice parameter may be native lattice parameters and the first native lattice parameter may lie in a range within 1.5% larger than and 0.9% smaller than the second native lattice parameter. In other words, it may be stated that the first native lattice parameter may be in a range from at least 99.1% of the second native lattice parameter to at most 101.5% of the second native lattice parameter. This may advantageously allow for maintaining lower stress in the epitaxial stack (150) as the epitaxial stack is formed. Lattice parameter measurement may be carried out by using High Resolution X-Ray Diffraction (HR-XRD) or by Transmission Electron Microscopy (TEM) as known to persons skilled in the art.

Without wishing to be bound by theory it may be stated that the difference in actual lattice parameter of the first epitaxial layer (120) and that of the second epitaxial layer (130) may depend on the difference in their individual native lattice parameters. Therefore, the smaller the difference between the individual native lattice parameters, then the smaller the difference may be between their individual actual lattice parameters. The smaller difference in actual lattice parameters of the first epitaxial layer (120) and the second epitaxial layer (130) may thus, help to increase critical thickness beyond which stress relaxation may occur, thereby allowing to form a thick epitaxial stack (150).

The increased critical thickness until stress relaxation occurs in the epitaxial stack (150) may originate from the presence of lower stress occurring on the second epitaxial layer (130) by the first epitaxial later (120). This may then advantageously lead to forming a thick epitaxial stack.

In some embodiments, the first epitaxial layer (120) may be overlying each substrate of the plurality of substrates. In some embodiments, the first epitaxial layer (120) may be in direct contact with each substrate of the plurality of substrates.

In some embodiments, the second epitaxial layer (130) may be overlying each substrate of the plurality of substrates. In some embodiments, the second epitaxial layer (130) may be in direct contact with each substrate of the plurality of substrates.

In embodiments, the first native lattice parameter may be 0.2% to 0.7% smaller than the second native lattice parameter. In embodiments, the first native lattice parameter may be at least from 0.2% to 0.3% smaller, or at least from 0.3% to 0.4% smaller, or at least from 0.4% to 0.5% smaller, or at least from 0.5% to 0.6% smaller, or at least from 0.6% to 0.7% smaller than the second native lattice parameter.

This may allow for a lower stress being induced by the first epitaxial layer (120) on the second epitaxial layer (130) in the epitaxial stack (150). As the epitaxial stack (150) grows by the formation of the first epitaxial layer (120) alternatingly and repeatedly with the formation of the second epitaxial layer (130), a delay on the occurrence of stress relaxation in the epitaxial stack (150) may be observed due to the lower stress thereby, allowing for forming a thick epitaxial stack (150). Formation of thick epitaxial stacks according to embodiments of the present disclosure may enable the manufacturing of 3DDRAM memory devices. Furthermore, formation of thick epitaxial stacks on the plurality of substrates may contribute to improving process throughput as well as manufacturing throughput for these devices. This may further lead to a decrease in manufacturing costs.

In embodiments, the first epitaxial layer (120) and the second epitaxial layer (130) may form an epitaxial pair. In embodiments, the number of epitaxial pairs comprised in the epitaxial stack (150) may be at least 50.

In embodiments, the first epitaxial layer (120) may comprise a first semiconductor material and the second epitaxial layer (130) may comprise a second semiconductor material. The provision of the first reaction gas mixture for forming the first epitaxial layer (120) may comprise providing a first semiconductor material precursor gas and providing a Group-VA element precursor comprising a Group-VA element. The Group-VA element in the first epitaxial layer (120) may be chosen such that its presence in the first epitaxial layer (120) may help to adjust the native lattice parameter of the first epitaxial layer (120) so that its native lattice parameter remains in the range of 0.2% to 1.0% smaller than that of the second epitaxial layer (130). This may then improve the formation of the epitaxial stack (150) as the lattice mismatch between the first epitaxial layer (120) and the second epitaxial layer (130) may be reduced. This may advantageously lead to delayed stress relaxation in the epitaxial stack (150) thereby, leading to the growth of a thick epitaxial stack (150).

Furthermore, the Group-VA element in the first epitaxial layer (120) may be chosen such that the second epitaxial layer may be epitaxially grown with high crystalline quality. Without wishing to be bound by theory it may be stated that once a monocrystalline first epitaxial layer (120) is grown, the second epitaxial layer (130) is to be grown monocrystalline also. In other words, each crystalline epitaxial layer may behave as a substrate for the growth of the next crystalline epitaxial layer.

In embodiments, the provision of the first semiconductor material precursor gas may be performed simultaneously with the provision of the Group-VA element precursor comprising the Group-VA element. In other words, the first semiconductor material precursor gas may be co-flown with the Group-VA element precursor comprising the Group-VA element. A uniform distribution of the Group-VA element within the first epitaxial layer (120) may thus, advantageously be obtained during the formation of the first epitaxial layer (120). Uniform distribution of the Group-VA element in the first epitaxial layer (130) may help to improve selective etching characteristics in later processing where the first epitaxial layer (120) may need to be removed from the epitaxial stack (150).

In embodiments, the first semiconductor material precursor gas may comprise substantially a first silicon-containing compound and the second semiconductor material precursor gas may comprise substantially a second silicon-containing compound.

In some embodiments, the first semiconductor material precursor gas and the second semiconductor material precursor gas may be provided together with an inert gas. In other words, the first semiconductor material precursor gas and the second semiconductor material precursor gas may be co-flown with an inert gas. In embodiments, the inert gas may comprise substantially $N_2$. In some embodiments, the inert gas may comprise substantially of one or more noble gases such, for example, He, Ne, Kr, Ar and Xe. In some embodiments, the inert gas may comprise substantially of at least one of $N_2$ and one or more of noble gases. In some embodiments, the first semiconductor material precursor gas and the second semiconductor material precursor gas may be co-flown with the inert gas and $H_2$.

In embodiments, at least one of the first silicon containing compound and the second silicon containing compound may be a mono silane, a high order silane or a cyclic silane. In some embodiments, the high order silane may be a high order straight chain silane. High order straight chain silane is represented by the general molecular formula of $Si_nH_{2n+2}$, where n is an integer from at least 2 to at most 20 such as, for example, disilane ($Si_2H_6$), trisilane ($Si_2H_8$), tetrasilane ($Si_4H_{10}$), pentasilane ($Si_5H_{12}$), hexasilane ($Si_6H_{14}$), heptasilane ($Si_7H_{16}$), octasilane ($Si_8H_{18}$), nonasilane ($Si_9H_{20}$), decasilane ($Si_{10}H_{22}$) or other high order straight chain silanes according to the general molecular formula of $Si_nH_{2n+2}$ and combinations thereof.

In some embodiments, the high order straight chain silane may be trisilane.

In some embodiments, the high order silane may be a high order branched silane. High order branched silanes have a general formula $Si_nH_{2n+2}$, where n is an integer from at least 4 to at most 20.

In some embodiments, the high order branched silane may be neopentasilane.

In some embodiments, other high order branched silanes may be used such as 2-silylpentasilane, 2,2-disilyltetrasilane, 2-silyltrisilane, 2-silyltetrasilane, 3-silylpentasilane, 2,2-disilyltrisilane, 2,3-disilylpentasilane, 2,2,3-trisilylpentasilane, 2,3,4-trisilylpentasilane, 2,3,4-trisilylpentasilane, 2,3-disilyltetrasilane, 2,2,3,3-tetrasilyltetrasilane, 2-silylhexasilane, 3-silylhexasilane, 3,4-disilylhexasilane, 2,3-disilylpentasilane, 2,4-disilylhexasilane, 4-silylheptasilane, 2,2-disilylpentasilane, 3,3-disilylpentasilane, 3,3-disilylhexasilane, 2,2-disilylhexasilane, 2,3-disilylhexsilane, 2-silylheptasilane, 3-silylheptasilane, 2,5-disilyhexasilane, 2,3,3-trisilylpentasilane and combinations thereof.

Cyclic silane has a general molecular formula of $Si_nH_{2n}$, where n is an integer from at least 3 to at most 20, and it is a silane with a ring structure. In some embodiments, the cyclic silane has one or more silyl substituents.

In some embodiments, the cyclic silane may be cyclohexasilane. The fact that cyclohexasilane has lower Si—Si and Si—H bond strengths may advantageously provide for forming epitaxial layers at lower temperatures according to embodiments of the present disclosure. Other cyclic silanes that may be used include cyclotrisilane ($Si_3H_6$), cyclotetrasilane ($Si_4H_8$), cyclopentasilane ($Si_5H_{10}$), cyclohexasilane ($Si_6H_{12}$), cycloheptasilane ($Si_7H_{14}$) or combinations thereof. Silyl substituted cyclic silanes may, in some embodiments, be used including silyl cyclotetrasilane, 1,2-disilylcyclopentasilane, 1,3-disilylcyclohexasilane, silylhexasilane and combinations thereof.

In some embodiments, the first silicon containing compound may be the same as the second silicon-containing compound. This may allow for making the formation of the epitaxial stack (150) easier. This may be accomplished, in embodiments, whereby the first semiconductor material precursor gas may be provided in a continuous flow, thereby forming the first epitaxial layer (120) while the provision of the Group-VA element precursor comprising the Group-VA element may be provided intermittently into the process chamber thereby forming the second epitaxial layer (130) after forming each of the first epitaxial layer (120) of the epitaxial stack (130).

In some embodiments, the first silicon containing compound may be different than the second silicon-containing compound.

In embodiments, the Group-VA element precursor may be a pnictogen hydride. The pnictogen hydride has a formula of $XH_3$, X being a pnictogen. In embodiments, the pnictogen hydride may be selected from the group consisting of arsine ($AsH_3$), phosphine ($PH_3$), stibine ($SbH_3$) and mixtures thereof. In some embodiments, alkylphosphines, having the formula $R_xPH_{3-x}$, where x ranges from zero to 3 and R is an alkyl selected from the group consisting of ethyl, methyl, butyl or propyl, may be used as the Group-VA element. In some embodiments, alkylphosphines may be selected from the group consisting of diethylphosphine, triethylphosphine, dimethylphosphine, trimethylphosphine and mixtures thereof.

In some embodiments, the Group-VA element precursor may be phosphine.

In embodiments, the first epitaxial layer (120) may have a phosphorus concentration in a range of 0.5 atomic % to 3 atomic %. In embodiments, the phosphorus concentration may be from at least 0.5 atomic % to 1 atomic %, or from at least 1 atomic % to 1.5 atomic %, or from at least 1.5 atomic % to 2 atomic %, or from at least 2 atomic % to 2.5 atomic %, from at least 2.5 atomic % to 3 atomic %.

Thanks to the presence of phosphorus in the first epitaxial layer (120) in this range, it may provide for having reduced stress in the first epitaxial layer (120) while allowing for growing thick epitaxial stack (150). Being able to grow a thick epitaxial stack (150) may be advantageous when the epitaxial stack is used in the manufacturing of memory devices such as for example 3DDRAM.

It is to be noted further that the concentration of phosphorus comprised in the first epitaxial layer (120) may play a role on the selective etching characteristics of the first epitaxial layer (120) with respect to the second epitaxial layer (130) in a later processing in the semiconductor manufacturing. Furthermore, a lower concentration of phosphorus comprised in the first epitaxial layer (120) may provide for a lower stress in the first epitaxial layer, thereby influencing the stress reduction in the epitaxial stack (150). However, it may compromise from the etch selectivity of the first epitaxial layer (120) with respect to the second epitaxial layer (130). Therefore, for efforts directed to focusing of enhancement in etch selectivity, a higher phosphorus concentration within the range of 0.5 atomic % to 3 atomic % may be preferred.

In an exemplary embodiment, the phosphorus concentration in the first epitaxial layer (120) is 3 atomic %, wherein the first semiconductor material comprised in the first epitaxial layer (120) may be silicon. The native lattice parameter of SiP having 3 atomic % phosphorus is 5.402 Å. In this exemplary embodiment, the second semiconductor material comprised in the second epitaxial layer (130) may also be silicon. The native lattice parameter of silicon is 5.431 Å. Therefore, in an epitaxial pair comprising SiP and Si layers, there is a small shift in native lattice parameter of the individual epitaxial layers (120, 130). In an epitaxial pair comprising SiGe with Ge, the concentration being 20 atomic %, and Si, the native lattice parameter is 5.502 Å, thus, presenting a little higher difference from the native lattice parameter of Si. Thus, the epitaxial stack (150) comprising SiP (3 atomic %) and Si, compared to an epitaxial stack comprising SiGe (20%) and Si, may advantageously allow for forming a thick epitaxial stack (150) thanks to the reduced stress relaxation in the epitaxial stack (150) due to the small shift between the native lattice parameters of SiP (3 atomic %) and Si. The native lattice parameters for SiP having 3 atomic % phosphorus, silicon and SiGe, with Ge the concentration being 20 atomic %, are measured at a temperature of 300 K.

In embodiments, neither the first reaction gas mixture nor the second reaction gas mixture may comprise providing a germanium comprising precursor gas. This may be advantageous in opening an alternative route to the formation of the epitaxial stack on the plurality of substrates, whereby thick epitaxial stack (150) may be obtained thanks to reduced stress relaxation. Furthermore, in semiconductor manufacturing, particularly in the manufacturing of memory devices such as for example 3DDRAM, the first epitaxial layer (120) may serve as a sacrificial layer. In other words, the first epitaxial layer (120) may be removed from the epitaxial stack (150) after the formation of the epitaxial stack (150) is completed. The second epitaxial layer (130) may thus be forming the channel layer of the memory device, such as 3DDRAM device. Thus, the fact that neither the first reaction gas mixture nor the second reaction gas mixture may comprise providing the germanium comprising precursor gas may provide an enhanced selectivity for removing the first epitaxial layer (120) with respect to the second epitaxial layer (130).

In embodiments, at least one of the first epitaxial layer (120) or the second epitaxial layer (130) may have a thickness in a range of 5 nm to 50 nm. In embodiments, at least one of the first epitaxial layer (120) or the second epitaxial layer (130) may have a thickness in a range from at least 5 nm to 15 nm, or from at least 15 nm to 25 nm, or from at least 25 nm to 35 nm, or from at least 35 nm to 50 nm.

We now return to FIG. 3 showing a change of etch rate as a function of temperature between crystalline SiP (Si containing a phosphorous dopant, in particular Si with 3 atomic %) and crystalline intrinsic Si. It is shown that etch rate of crystalline intrinsic Si increases as a function of temperature, particularly in a temperature range of 450° C. to 550° C., while the etch rate of crystalline SiP shows a slight increase in etch rate going from 300° C. to 375° C., beyond which the etch rate remains relatively constant until 550° C. The etching of these films were performed using $Cl_2$ gas provided with a carrier gas, the carrier gas being $N_2$ gas. It is indicative from this graph that the difference in etch rate between crystalline intrinsic Si and crystalline SiP may advantageously provide for etch selectivity towards crystalline SiP. This may this be advantageous to etch crystalline SiP (Si with 3 atomic % P) selective to crystalline intrinsic Si at temperatures below 450° C. using $Cl_2$ in $N_2$ carrier gas.

In embodiments, the process temperature, which is the temperature at which the process chamber may be maintained during the formation of the epitaxial stack (150) may be in a range of 300° C. to 500° C. In some embodiments, the process temperature may be in a range of 400° C. to 500° C. It may be an advantage to carry out the formation of the epitaxial stack (150) in this temperature range as there may be a risk for diffusion of the Group-VA element into the second epitaxial layer (130) may be undesirable since it may diminish the etch selectivity between the first epitaxial layer (120) and the second epitaxial layer (130) in an etch step further in the semiconductor manufacturing process. It is to be understood that individual thickness of the first epitaxial layer (120) and the second epitaxial layer (130) may be configured such that a tendency of diffusion of the Group-VA element may be reduced so that etch selectivity between the first epitaxial layer (120) and the second epitaxial layer (130) may be maintained.

In embodiments, the process pressure, which is the pressure at which the process chamber may be maintained during the formation of the epitaxial stack (150) may be in a range of 0.5 Torr to 90 Torr. In some embodiments, the process pressure may be in a range of from at least 20 Torr to at most 30 Torr, or from at least 30 Torr to at most 40 Torr, or from at least 40 Torr to at most 50 Torr, or from at least 50 Torr to at most 60 Torr.

In some embodiments, the first epitaxial layer (120) may be a SiP layer with phosphorus being in the range of 0.5 atomic % to 3 atomic %, while the second epitaxial layer may be a Si layer with 100 atomic % silicon. The SiP layer (120) and Si layer (130) may be grown at a process temperature of 450° C. and under a process pressure of 60 Torr.

We now return to FIG. 4 showing a flowchart of an exemplary method according to embodiments of the second aspect of the present disclosure.

The method (600) of forming an epitaxial stack (150) on a plurality of substrates may comprise providing (610) the plurality of substrates to a process chamber. In embodiments, the process chamber may extend in a longitudinal direction.

In embodiments, the process chamber may be comprised in a vertical furnace and may thus, extend longitudinally in a vertical direction. The plurality of substrates may be arranged in a substrate boat and the substrate boat may be receivable in the process chamber. The method (600) may further comprise forming the epitaxial stack (150) on the plurality of substrates. The formation of the epitaxial stack (150) may comprise a formation of a first epitaxial layer (120) alternatingly and repeatedly with a formation of a second epitaxial layer (130). Each of the first epitaxial layers (120) may comprise a phosphorus concentration in a range of 0.5 atomic % to 3 atomic % and a silicon concentration in a range of 97 atomic % to 99.5 atomic % Each of the second epitaxial layers (130) may comprise a silicon concentration of 100 atomic %. This may advantageously help maintaining lower stress relaxation in the epitaxial stack (150), thereby allowing for forming a thick the epitaxial stack (150). Epitaxial stacks (1500 having a total thickness greater than 10 micron may be considered as being thick epitaxial stacks. Atomic percentages may be measured by using High Resolution X-Ray Diffraction (HR-XRD).

In embodiments, each of the first epitaxial layers (120) may comprise a phosphorus concentration in a range of from at least 0.5 atomic % to 1 atomic %, or from at least 1 atomic % to 2 atomic %, or from at least 2 atomic % to 3 atomic %, while the silicon concentration may respectively be in a range from at least 97 atomic % to 98 atomic %, or from at least 98 atomic % to 99 atomic %, or from at least 99 atomic % to 99.5 atomic %.

In an exemplary embodiment, the phosphorus concentration in the first epitaxial layer is 3 atomic %, wherein the first semiconductor material comprised in the first epitaxial layer (120) may be silicon with 97 atomic %. The native lattice parameter of SiP having 3 atomic % phosphorus is 5.402 A°. In this exemplary embodiment, the second semiconductor material comprised in the second epitaxial layer (130) may also be silicon with 100 atomic % concentration. The native lattice parameter of silicon is 5.431 A°. Therefore, in an epitaxial pair comprising SiP (3 atomic %) and Si layers, there is a small shift in native lattice parameter of the individual epitaxial layers (120, 130). In an epitaxial pair comprising SiGe with Ge concentration being 20 atomic %, and Si, the native lattice parameter of SiGe (20 atomic %) is 5.502 A°, thus presenting a little higher difference from the native lattice parameter of Si. Thus, the epitaxial stack comprising SiP (3 atomic %) and Si, compared to an epitaxial stack comprising SiGe (20%) and Si, may advantageously allow for forming a thick epitaxial stack (150) compared to the epitaxial stack comprising SiGe (20 atomic %) thanks to the reduced lattice mismatch stress due to the small shift between the native lattice parameters of SiP (3 atomic %) and Si.

In embodiments, at least one of the first epitaxial layer (120) or the second epitaxial layer (130) may have a thickness in a range of 5 nm to 50 nm. In embodiments, at least one of the first epitaxial layer (120) or the second epitaxial layer (130) may have a thickness in a range from at least 5 nm to 15 nm, or from at least 15 nm to 25 nm, or from at least 25 nm to 35 nm, or from at least 35 nm to 50 nm.

In embodiments, the first epitaxial layer (120) and the second epitaxial layer (130) may form an epitaxial pair. In embodiments, the number of epitaxial pairs comprised in the epitaxial stack (150) may be at least 50.

In embodiments, the formation of the first epitaxial layer (120) may comprise providing a first semiconductor material precursor gas. The first semiconductor material precursor gas may comprise substantially a first silicon-containing compound. The formation of the first epitaxial layer (120) may also comprise providing phosphine. The formation of the second epitaxial layer (130) may comprise providing a second semiconductor material precursor gas. The second semiconductor material precursor gas may comprise substantially a second silicon-containing compound.

In some embodiments, the first semiconductor material precursor gas and the second semiconductor material precursor gas may be provided together with an inert gas. In other words, the first semiconductor material precursor gas and the second semiconductor material precursor gas may be co-flown with an inert gas. In embodiments, the inert gas may comprise substantially $N_2$. In some embodiments, the inert gas may comprise substantially of one or more noble gases such, for example, He, Ne, Kr, Ar and Xe. In some embodiments, the inert gas may comprise substantially of at least one of $N_2$ and one or more of noble gases. In some embodiments, the first semiconductor material precursor gas and the second semiconductor material precursor gas may be co-flown with the inert gas and $H_2$.

In some embodiments, the first silicon containing compound may be the same as the second silicon-containing compound. This may allow for making the formation of the epitaxial stack (150) easier. This may be accomplished, in embodiments, whereby the first semiconductor material precursor gas may be provided in a continuous flow, thereby forming the first epitaxial layer (120) while the provision of phosphine may be provided intermittently into the process chamber thereby forming the second epitaxial layer (130) after forming each of the first epitaxial layer (120) of the epitaxial stack (150).

In some embodiments, the first silicon containing compound may be different than the second silicon-containing compound.

In embodiments, at least one of the first silicon containing compound and the second silicon containing compound may be a mono silane, a high order silane or a cyclic silane.

In some embodiments, the high order silane may be a high order straight chain silane. High order straight chain silane is represented by the general molecular formula of $Si_nH_{2n+2}$, where n is an integer from at least 2 to at most 20 such as, for example, disilane ($Si_2H_6$), trisilane ($Si_3H_8$), tetrasilane ($Si_4H_{10}$), pentasilane ($Si_5H_{12}$), hexasilane ($Si_6H_{14}$), heptasilane ($Si_7H_{16}$), octasilane ($Si_{18}H_{18}$), nonasilane ($Si_9H_{20}$), decasilane ($Si_{10}H_{22}$) or other high order straight chain silanes according to the general molecular formula of $Si_nH_{2n+2}$ and combinations thereof.

In some embodiments, the high order straight chain silane may be trisilane.

In some embodiments, the high order silane may be a high order branched silane. High order branched silanes have a general formula $Si_nH_{2n+2}$, where n is an integer from at least 4 to at most 20.

In some embodiments, the high order branched silane may be neopentasilane.

In some embodiments, other high order branched silanes may be used such as 2-silylpentasilane, 2,2-disilyltetrasilane, 2-silyltrisilane, 2-silyltetrasilane, 3-silylpentasilane, 2,2-disilyltrisilane, 2,3-disilylpentasilane, 2,2,3-trisilylpentasilane, 2,3,4-trisilylpentasilane, 2,3,4-trisilylpentasilane, 2,3-disilyltetrasilane, 2,2,3,3-tetrasilyltetrasilane, 2-silylhexasilane, 3-silylhexasilane, 3,4-disilylhexasilane, 2,3-disilylpentasilane, 2,4-disilylhexasilane, 4-silylheptasilane, 2,2-disilylpentasilane, 3,3-disilylpentasilane, 3,3-disilylhexasilane, 2,2-disilylhexasilane, 2,3-disilylhexsilane, 2-silylheptasilane, 3-silylheptasilane, 2,5-disilylhexasilane, 2,3,3-trisilylpentasilane and combinations thereof.

Cyclic silane has a general molecular formula of $Si_nH_{2n}$, where n is an integer from at least 3 to at most 20, and it is a silane with a ring structure. In some embodiments, the cyclic silane has one or more silyl substituents.

In some embodiments, the cyclic silane may be cyclohexasilane. The fact that cyclohexasilane has lower Si—Si and Si—H bond strengths may advantageously provide for forming epitaxial layers at lower temperatures according to embodiments of the present disclosure. Other cyclic silanes that may be used include cyclotrisilane ($Si_3H_6$), cyclotetrasilane ($Si_4H_6$), cyclopentasilane. ($Si_5H_{10}$), cyclohexasilane ($Si_6H_{12}$), cycloheptasilane ($Si_7H_{14}$) or combinations thereof. Silyl substituted cyclic silanes may, in some embodiments, be used including silyl cyclotetrasilane, 1,2-disilylcyclopentasilane, 1,3-disilylcyclohexasilane, silylhexasilane and combinations thereof.

In embodiments, the process temperature, which is the temperature at which the process chamber may be maintained during the formation of the epitaxial stack (150) may be in a range of 300° C. to 500° C. In some embodiments, the process temperature may be in a range of 400° C. to 500° C. It may be an advantage to carry out the formation of the epitaxial stack (150) in this temperature range as there may be a risk for diffusion of the Group-VA element into the second epitaxial layer (130) at temperatures above 500° C. Diffusion of the Group-VA element into the second epitaxial layer (130) may be undesirable since it may diminish the etch selectivity between the first epitaxial layer (120) and the second epitaxial layer (130) in an etch step further in the semiconductor manufacturing process. It is to be understood that individual thickness of the first epitaxial layer (120) and the second epitaxial layer (130) may be configured such that a probability of diffusion of the Group-VA element may be reduced so that etch selectivity between the first epitaxial layer (120) and the second epitaxial layer (130) may be maintained.

In embodiments, the process pressure, which is the pressure at which the process chamber may be maintained during the formation of the epitaxial stack (150) may be in a range of 0.5 Torr to 90 Torr. In some embodiments, the process pressure may be in a range of from at least 20 Torr to at most 30 Torr, or from at least 30 Torr to at most 40 Torr, or from at least 40 Torr to at most 50 Torr, or from at least 50 Torr to at most 60 Torr.

In some embodiments, the first epitaxial layer (120) may be a SiP layer while the second epitaxial layer may be a Si layer. The SiP layer (120) and Si layer (130) may be grown at a process temperature of 450° C. and under a process pressure of 60 Torr.

In embodiments, neither the first epitaxial layer (120) nor the second epitaxial layer (130) may comprise germanium. This may provide an alternative route to the formation of the epitaxial stack (150) on the plurality of substrates, whereby thick epitaxial stack (150) may be obtained thanks to reduced stress relaxation. Furthermore, in semiconductor manufacturing, particularly in the manufacturing of memory devices such as for example 3DDRAM devices, the first epitaxial layer (120) may serve as a sacrificial layer. In other words, the first epitaxial layer (120) may be removed from the epitaxial stack (150) after the formation of the epitaxial stack (150) is completed. The second epitaxial layer (130) may thus be forming the channel layer of the memory devices, such as 3DDRAM device. Thus, the fact that neither the first epitaxial layer (120) nor the second epitaxial layer (130) may comprise germanium may provide an enhanced selectivity for removing the first epitaxial layer (120) with respect to the second epitaxial layer (130).

We now return to FIG. 5 showing a schematic representation of a substrate processing apparatus according to embodiments of the third aspect of the present disclosure.

The substrate processing apparatus (1000) for forming an epitaxial stack (150) on a plurality of substrates (110) may comprise a process chamber (1300) extending in a longitudinal direction. The longitudinal direction (1300) may, in embodiments, correspond to a vertical direction. The apparatus (1000) may further comprise a substrate boat (1500) for holding the plurality of substrates (110), the substrate boat (1500) being receivable in the process chamber (1300).

In embodiments, the process chamber (1300) may thus, be comprised in a vertical furnace (1400). This may advantageously allow for processing the plurality of substrates (110) at the same time in the process chamber (1300).

In embodiments, each substrate (110) of the plurality of substrates may comprise a semiconductor layer. The semiconductor layer may, in some embodiments, be a silicon layer. The silicon layer may, in embodiments, be a Si{100}, a Si{111} or a Si{110} layer.

In embodiments, each substrate (110) of the plurality of substrates may be semiconductor substrates. The semiconductor substrates may, in some embodiments, be Si {111} substrates, Si {110} or Si {100} substrate.

The apparatus (1000) may further comprise a heater (1100) configured for heating and maintaining process temperature in the process chamber (1300). The apparatus (1000) may further comprise a silane precursor storage module (1910) and a Group-VA element precursor storage module (1920). The silane precursor storage module (1910) may comprise at least one of a mono silane precursor, a high order straight chain silane precursor, a high order branched silane precursor and a cyclic silane precursor. The storage modules (1910, 1920) may be connected to the manifold (1800) through gas supply lines (1810, 1820) arranged for delivering at least one of the silane precursors or the Group-VA element precursor, respectively. The manifold (1800) may be operably connected to a gas injector (1700) through a gas inlet (1840). The gas injector (1700) may be configured and arranged for providing the silane precursor or the Group-VA element precursor to the process chamber (1300).

A pressure controller may also be comprised in the apparatus (1000) configured for attaining and maintaining process pressure in the process chamber (1300). The apparatus (1000) may further comprise a controller (1200) configured for executing instructions that may be comprised in a non-transitory computer readable medium and to cause the substrate processing apparatus (1000) to form the epitaxial stack (150) on the plurality of substrates (110) in accordance with a method according to the first aspect or the second aspect of the present disclosure.

The substrate processing apparatus (1000) may further comprise a gas outlet (1900) for removing the silane precursor or the Group-VA element precursor from the process chamber (1300) after completion of the formation of the first epitaxial layer (120) or the second epitaxial layer (130) in accordance with a method according to the first aspect or the second aspect of the present disclosure.

The substrate processing apparatus (1000) may be advantageous in forming the epitaxial stack on the plurality of substrates (110), whereby the substrates may have reduced stress relaxation. Particularly, the substrate processing apparatus (1000) may provide the advantage of forming thick epitaxial stacks (150) on the plurality of substrates (110).

Thus, the semiconductor processing apparatus (1000) may be advantageous for the manufacturing of memory devices such as, for example, 3DDRAM devices.

The semiconductor processing apparatus (1000) may further help to reduce manufacturing costs and reduce manufacturing throughput since plurality of substrates (110) may be processes at a time.

The invention claimed is:

1. A method of forming an epitaxial stack on a plurality of substrates; the method comprising
  providing the plurality of substrates to a process chamber; and
  executing a plurality of deposition cycles, thereby forming the epitaxial stack on the plurality of substrates, the epitaxial stack comprising a first epitaxial layer stacked alternatingly and repeatedly with a second epitaxial layer, the second epitaxial layer being different from the first epitaxial layer, wherein the first epitaxial layer has a phosphorus concentration in a range of 0.5 atomic % to 3 atomic %, and wherein a deposition cycle comprises:
    a first deposition pulse comprising a provision of a first reaction gas mixture to the process chamber, thereby forming the first epitaxial layer having a first lattice parameter, and
    a second deposition pulse comprising a provision of a second reaction gas mixture to the process chamber, the second reaction gas mixture being different from the first reaction gas mixture, thereby forming the second epitaxial layer having a second lattice parameter, wherein the first and the second lattice parameters are native lattice parameters, and wherein the first lattice parameter lies in a range within 1.5% larger than and 0.9% smaller than the second lattice parameter.

2. The method according to claim 1, wherein the first lattice parameter is 0.2% to 0.7% smaller than the second lattice parameter.

3. The method according to claim 1, wherein the first epitaxial layer comprises a first semiconductor material,
  wherein the provision of the first reaction gas mixture comprises:
    providing a first semiconductor material precursor gas, and
    providing a Group-VA element precursor comprising a Group-VA element,
  wherein the second epitaxial layer comprises a second semiconductor material, and
  wherein the provision of the second reaction gas mixture comprises providing a second semiconductor material precursor gas.

4. The method according to claim 3, wherein the provision of the first semiconductor material precursor gas is performed simultaneously with the provision of the Group-VA element precursor comprising the Group-VA element.

5. The method according to claim 3, wherein the first semiconductor material precursor gas comprises substantially a first silicon-containing compound and the second semiconductor material precursor gas comprises substantially a second silicon-containing compound.

6. The method according to claim 5, wherein the first silicon-containing compound is the same as the second silicon-containing compound.

7. The method according to claim 3, wherein the first semiconductor material precursor gas is provided in a continuous flow and wherein the Group-VA element precursor comprising the Group-VA element is provided intermittently.

8. The method according to claim 3, wherein the Group-VA element precursor is phosphine.

9. The method according to claim 1, wherein neither the provision of the first reaction gas mixture nor the provision of the second reaction gas mixture comprises providing a Ge-comprising precursor gas.

* * * * *